(12) United States Patent
Noh et al.

(10) Patent No.: US 12,354,617 B2
(45) Date of Patent: Jul. 8, 2025

(54) CONTEXT-AWARE VOICE INTELLIGIBILITY ENHANCEMENT

(71) Applicant: DTS, Inc., Calabasas, CA (US)

(72) Inventors: Daekyoung Noh, Calabasas, CA (US); Pavel Chubarev, Calabasas, CA (US); Xiaoyu Guo, Calabasas, CA (US)

(73) Assignee: DTS, Inc., Calabasas, CA (US)

( * ) Notice: Subject to any disclaimer, the term of this patent is extended or adjusted under 35 U.S.C. 154(b) by 611 days.

(21) Appl. No.: 17/669,615

(22) Filed: Feb. 11, 2022

(65) Prior Publication Data

US 2022/0165287 A1 May 26, 2022

Related U.S. Application Data

(63) Continuation of application No. PCT/US2020/049933, filed on Sep. 9, 2020.

(Continued)

(51) Int. Cl.
*G10L 21/0232* (2013.01)
*G10L 15/18* (2013.01)
(Continued)

(52) U.S. Cl.
CPC .......... *G10L 21/0232* (2013.01); *G10L 15/18* (2013.01); *G10L 15/22* (2013.01);
(Continued)

(58) Field of Classification Search
CPC ............. G10L 15/18; G10L 15/22; G10L 2021/02082; G10L 2021/02163;
(Continued)

(56) References Cited

U.S. PATENT DOCUMENTS 6,249,237 B1 6/2001 Prater
6,993,480 B1 1/2006 Klayman
(Continued)

FOREIGN PATENT DOCUMENTS

CN 105489224 A * 4/2016
CN 105702262 A * 6/2016
(Continued)

OTHER PUBLICATIONS

Ansi, S3 22-1997. "Methods for calculation of the speech intelligibility index." American National Standard Institute, pp. 1-28 (1997).

(Continued)

*Primary Examiner* — Bhavesh M Mehta
*Assistant Examiner* — Philip H Lam
(74) *Attorney, Agent, or Firm* — Lerner David LLP

(57) ABSTRACT

A method comprises: detecting noise in an environment with a microphone to produce a noise signal; receiving a voice signal to be played into the environment through a loudspeaker; performing multiband correction of the noise signal based on a microphone transfer function of the microphone, to produce a corrected noise signal; performing multiband correction of the voice signal based on a loudspeaker transfer function of the loudspeaker to produce a corrected voice signal; and computing multiband voice intelligibility results based on the corrected noise signal and the corrected voice signal.

18 Claims, 10 Drawing Sheets

Related U.S. Application Data

(60) Provisional application No. 62/898,977, filed on Sep. 11, 2019.

(51) Int. Cl.
  *G10L 15/22* (2006.01)
  *G10L 21/0208* (2013.01)
  *G10L 21/0216* (2013.01)
  *G10L 21/038* (2013.01)

(52) U.S. Cl.
  CPC .. *G10L 21/038* (2013.01); *G10L 2021/02082* (2013.01); *G10L 2021/02163* (2013.01)

(58) Field of Classification Search
  CPC ........... G10L 25/18; G10L 25/60; H03G 3/32; H03G 9/025
  See application file for complete search history.

(56) References Cited

U.S. PATENT DOCUMENTS

| | | |
|---|---|---|
| 8,204,742 B2 | 6/2012 | Yang et al. |
| 8,386,247 B2 | 2/2013 | Yang et al. |
| 9,117,455 B2 | 8/2015 | Tracey et al. |
| 9,947,337 B1* | 4/2018 | Wang ................... H04R 3/02 |
| 2002/0075856 A1* | 6/2002 | LeBlanc ............. H04J 3/1688 |
| | | 379/406.01 |
| 2003/0112261 A1* | 6/2003 | Zhang ................. G11B 27/28 |
| 2004/0057586 A1* | 3/2004 | Licht .................... H03G 3/32 |
| | | 381/94.1 |
| 2006/0293882 A1* | 12/2006 | Giesbrecht ............ G10L 21/02 |
| | | 704/E15.009 |
| 2007/0112563 A1 | 5/2007 | Krantz et al. |
| 2009/0007596 A1* | 1/2009 | Goldstein ............ A61B 5/6817 |
| | | 63/1.11 |
| 2009/0010443 A1* | 1/2009 | Ahnert ..................... G01H 7/00 |
| | | 381/59 |
| 2009/0191817 A1* | 7/2009 | Gupta ................. H04W 52/243 |
| | | 455/67.13 |
| 2009/0225980 A1* | 9/2009 | Schmidt ............... H04M 9/082 |
| | | 379/406.02 |
| 2011/0066428 A1 | 3/2011 | Yang et al. |
| 2011/0176687 A1* | 7/2011 | Birkenes .............. H04M 9/085 |
| | | 381/66 |
| 2012/0259625 A1 | 10/2012 | Yang et al. |
| 2013/0030800 A1* | 1/2013 | Tracey ................... G10L 21/003 |
| | | 704/219 |
| 2013/0218560 A1* | 8/2013 | Hsiao .................... G10L 21/034 |
| | | 704/233 |
| 2014/0056435 A1* | 2/2014 | Kjems ...................... G10L 15/20 |
| | | 381/317 |
| 2015/0011266 A1* | 1/2015 | Feldt .................... H04M 9/082 |
| | | 455/570 |
| 2015/0019213 A1* | 1/2015 | Nongpiur ............ G10L 21/0208 |
| | | 704/225 |
| 2015/0226831 A1* | 8/2015 | Nakamura ............... G01S 3/801 |
| | | 367/118 |
| 2016/0029142 A1* | 1/2016 | Isaac ....................... H04S 7/307 |
| | | 381/303 |
| 2016/0078879 A1* | 3/2016 | Lu .......................... G10L 21/02 |
| | | 381/56 |
| 2016/0260423 A1* | 9/2016 | Rosenkranz ......... H04R 25/453 |
| 2016/0287180 A1* | 10/2016 | Ansari ................. A61B 8/5223 |
| 2017/0265010 A1* | 9/2017 | Kavalekalam ....... H04R 25/552 |
| 2017/0345440 A1* | 11/2017 | Matsuo .................... H04R 3/04 |
| 2018/0077507 A1* | 3/2018 | Bernal Castillo ...... G01H 17/00 |
| 2018/0359560 A1* | 12/2018 | Defraene ........... G10K 11/17854 |
| 2019/0206420 A1* | 7/2019 | Kandade Rajan .. G10L 21/0264 |
| 2019/0318757 A1* | 10/2019 | Chen ..................... G10L 19/022 |
| 2020/0020315 A1* | 1/2020 | Tachi .................. G10K 11/17823 |
| 2020/0194006 A1* | 6/2020 | Grancharov ............ G06F 17/18 |

FOREIGN PATENT DOCUMENTS

| | | |
|---|---|---|
| JP | 4482247 B2 * | 6/2010 |
| KR | 20110043699 A | 4/2011 |
| WO | 2010009414 A1 | 1/2010 |
| WO | 2011019339 A1 | 2/2011 |

OTHER PUBLICATIONS

Choo, K., et al., "Enhancement of Voice Intelligibility for mobile speech communication in noisy environments", Convention Paper 9810, Audio Engineering Society, Presented at the 143rd Convention Oct. 18-21, 2017, New York, NY, USA, pp. 1-6 (2017).

Faiget, L., et al., "Speech Intelligibility Model Including Room and Loudspeaker Influences", J. Acoust. Soc. Am., vol. 105 (6), pp. 3345-3354 (Jun. 1999).

Hu, Y, and P.C. Loizou, "A Perceptually Motivated Approach for Speech Enhancement", IEEE Transactions on Speech and Audio Processing, vol. 11(5), pp. 457-465 (2003).

Postma Barteld NJ, et al., "Perceptive and Objective Evaluation of Calibrated Room Acoustic Simulation Auralizations", J. Acoust. Soc. Am., vol. 140 (6), pp. 4326-4337 (Dec. 2016).

Rhebergen, K.S., and N.J. Versfeld, "A Speech Intelligibility Index-based approach to predict the speech reception threshold for sentences in fluctuating noise for normal-hearing listeners", The Journal of the Acoustical Society of America, vol. 117(4), pp. 2181-2192 (2005).

Thomas, I.B, "The Influence of First and Second Formants on the Intelligibility of Clipped Speech", Journal of the Audio Engineering Society, vol. 16(2), 182-185 (1968).

Search Report and Written Opinion from corresponding International Patent Application No. PCT/US2020/049933, mailed Jan. 26, 2021.

\* cited by examiner

CONTEXT-AWARE VOICE INTELLIGIBILITY ENHANCEMENT

PRIORITY CLAIM

This application is a continuation of International Application No. PCT/US2020/049933, filed on Sep. 9, 2020, which claims the benefit of U.S. provisional patent application No. 62/898,977, Sep. 11, 2019, the entireties of which are incorporated herein by reference.

TECHNICAL FIELD

The present disclosure relates to voice intelligibility processing.

BACKGROUND

Voice playback devices such as Artificial Intelligence (AI) speakers, mobile phones, teleconference, Internet of Things (IoT) devices, and so forth are often used in acoustic environments that include high levels of background noise. The voice played by the voice playback devices may be masked by the background noise resulting in degraded voice intelligibility. Many techniques for increasing voice intelligibility are available. Some of the techniques also enhance the intelligibility of voice in a noisy environment using a noise capture device. The techniques, however, do not specify and address practical challenges associated with implementation specific limitations, such as physical limitations of the playback device, physical limitations of the noise capture device, signal headroom for voice intelligibility processing, and long term voice characteristics.

DESCRIPTION OF EXAMPLE EMBODIMENTS

Example Embodiments

Addressing the above-described challenges and concerns can achieve optimum performance of a natural transition from unprocessed voice to processed voice. Accordingly, embodiments presented herein introduce novel features and improvements for voice intelligibility analysis that increase voice intelligibility in a noisy environment, and overcome the practical challenges described herein. The embodiments include, but are not limited to, (1) digital-to-acoustic level conversion combined with multiband voice and noise correction, (2) short segment voice intelligibility analysis, (3) voice and noise profiling for long segments, and (4) global and per-band gain analysis. Because results of analysis performed in the embodiments produces relative gain adjustment parameters for a voice signal for playback, both broadband and per-frequency band, the processing in the embodiments is not limited to specific audio signal processing, and may include any combination of known dynamic processing such as compressor, expander, and formants enhancement.

As used herein, the terms: "speech," "voice," and "voice/speech" are synonymous and may be used interchangeably; "frame," "segment," and "time segment" are synonymous and may be used interchangeably; "speech (or voice) intelligibility" and "intelligibility" are synonymous and may be used interchangeably; "bin" and "band" are synonymous and may be used interchangeably; and "bandwidth (BW)" and "passband" are synonymous and may be used interchangeably.

Figure 1:
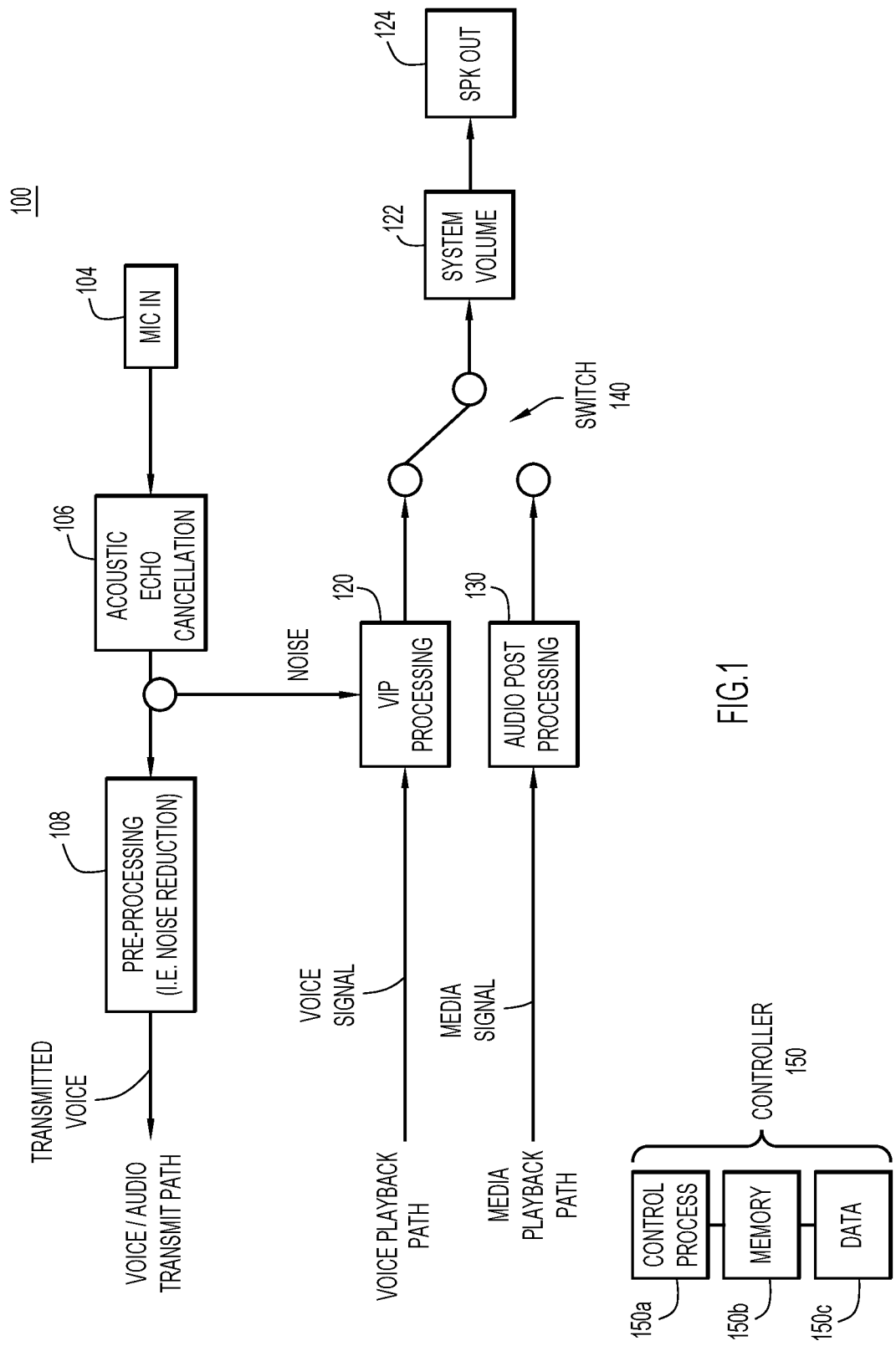
FIG. 1 is a high-level block diagram of an example system in which embodiments directed to voice intelligibility processing may be implemented.

FIG. 1 is an example system 100 in which embodiments presented herein may be implemented. System 100 is one example, and many variations are possible. Such variations may omit or add audio components. System 100 may represent a voice communication device that supports voice communication, e.g., voice calls, with a remote communicate device, not shown. System 100 may also represent a multimedia playback device coupled with the communication device. Non-limiting examples of system 100 include phones (e.g., mobile phones, smartphones, voice-over-Internet Protocol (IP) (VoIP) phones, and the like), computers (e.g., tabletop computers, laptops, tablets and the like), and home theatre sound systems equipped with voice communication devices.

System 100 is deployed in an acoustic environment, e.g., a room, open space, or the like. System 100 includes a voice transmit path, a voice playback path, and a media playback path coupled to each other. The voice transmit includes a microphone 104 that represents a voice/noise capture device (also referred to simply as a "noise capture device"), an acoustic echo canceler 106, and a noise pre-processor 108 coupled to one another. Microphone 104 converts sound in the acoustic environment to a sound signal representative of the sound. The sound signal represents background noise (referred to simply as "noise") in the acoustic environment and may also represent voice from a talker. Acoustic echo canceler 106 and noise pre-processor 108 (collectively "pre-processors") respectively cancel echo and reduce noise in the sound signal, and transmit a processed sound signal (e.g., processed voice) for playback at a remote station, for example.

The voice playback path includes a voice intelligibility processor (VIP) 120, a system volume control 122, and a loudspeaker 124 (more generally, a playback device). In the voice playback path, VIP 120 receives a voice signal (i.e., a voice playback signal) to be played back through loudspeaker 124. For example, the voice signal may have been transmitted from the above-mentioned remote communication device (e.g., a remote mobile phone) to system 100 for playback. In addition, VIP 120 receives from microphone 104 a noise signal representative of the noise in the acoustic environment. The noise signal received by VIP 120 may be an echo-canceled noise signal produced by acoustic echo canceler 106, to avoid self-activation of the VIP. In accordance with the embodiments presented herein, VIP 120 processes the voice signal for playback along with the noise signal (e.g., the noise sensed by microphone 104) concurrently to enhance intelligibility of the voice signal, to produce an intelligibility enhanced voice signal. VIP 120 provides the intelligibility enhanced voice signal to loudspeaker 124 (through system volume control 122) for playback by the loudspeaker into the acoustic environment.

The media playback path includes an audio post-processor 130, system volume control 122, and loudspeaker 124. Audio post-processor 130 processes a media signal for playback by loudspeaker 124 (through system volume control 122). System 100 may also include a switch 140 to selectively direct either the voice playback or the media playback to loudspeaker 124.

System 100 also includes a controller 150 coupled to microphone 104 and loudspeaker 124. Controller 150 may be configured to implement acoustic echo canceler 106, noise pre-processor 108, VIP 120, audio post-processor 130, switch 140, and system volume control 122, for example. Controller 150 includes a processor 150*a* and memory 150*b*. Processor 150*a* may include a microcontroller or microprocessor, for example, configured to execute software instructions stored in memory 150*b*. Memory 150*b* may comprise read only memory (ROM), random access memory (RAM), or other physical/tangible (e.g., non-transitory) memory storage devices. Thus, in general, memory 150*b* may comprise one or more computer readable storage media (e.g., a memory device) encoded with software comprising computer executable instructions and when the software is executed (by processor 150*a*) it is operable to perform operations described herein. For example, memory 150*b* stores or is encoded with instructions for control logic to implement VIP 120 (e.g., the modules of the VIP described below in connection with FIGS. 2-9) and other modules of system 100 described above, and to perform overall control of system 100.

Memory 150*b* also stores information/data 150*c* described herein that is used and generated by the control logic.

Figure 2:
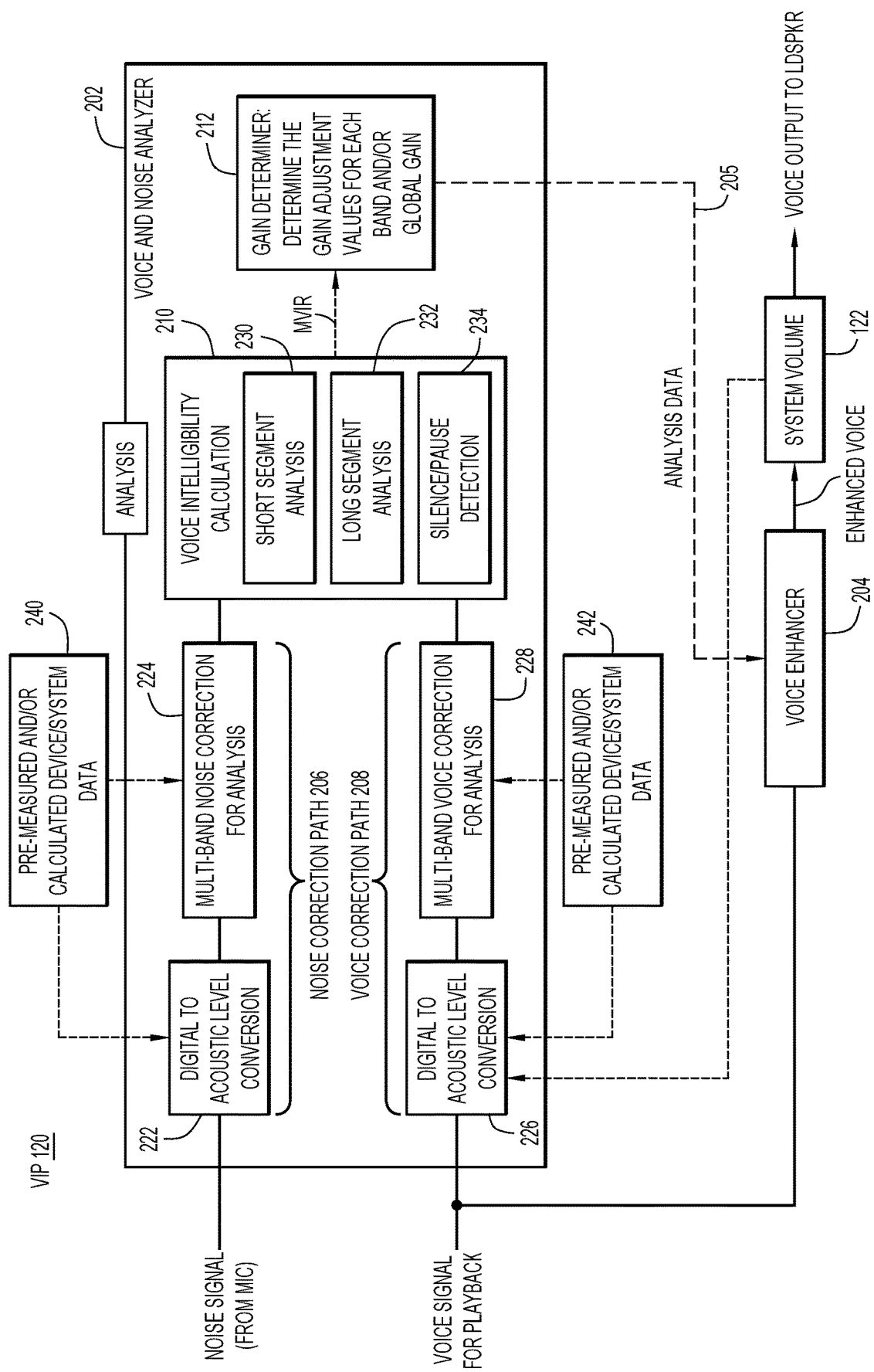
FIG. 2 is a block diagram of an example voice intelligibility processor (VIP) and associated voice and noise processing implemented in the system of FIG. 1.

FIG. 2 is an example high-level block diagram of VIP 120, and processing performed by the VIP, according to an embodiment. VIP includes a voice and noise analyzer 202 coupled to a voice enhancer 204. Voice and noise analyzer 202 receives the noise signal from microphone 104. Voice and noise analyzer 202 also receives the voice signal for playback. In an example, the noise signal and the voice signal are time domain signals, and may each be in a pulse code modulation (PCM) format, although other formats are possible. Voice and noise analyzer 202 analyzes/processes the noise signal and the voice signal concurrently, to produce multiband voice intelligibility results 205, and provides the same to voice enhancer 204. Voice enhancer 204 processes the voice signal based on multiband voice intelligibility results 205 to enhance or increase intelligibility of the voice signal, to produce the intelligibility enhanced voice signal. The intelligibility enhanced voice signal is played back through system volume control 122 and loudspeaker 124.

Voice and noise analyzer 202 includes a noise correction path 206, a voice correction path 208, a voice intelligibility calculator 210 following the two correction paths, and a gain determiner 212 following the voice intelligibility calculator 210. Noise correction path 206 includes a noise digital-to-acoustic level converter (DALC) 222 and a multiband noise corrector 224 following the noise DALC. Voice correction path 208 includes a voice DALC 226 and a multiband voice corrector 228 following the voice DALC. Voice intelligibility calculator 210 includes a short segment analyzer 230, a long segment analyzer 232, and a silence/pause detector 234. Noise correction path 206 receives pre-measured and/or derived noise pickup device parameters 240 (e.g., known microphone parameters) that characterize or are associated with microphone 104. Voice correction path 208 receives pre-measured and/or derived playback device parameters 242 (e.g., known loudspeaker parameters) that characterize or are associated with loudspeaker 124.

At a high-level, noise correction path 206 applies multiband noise correction to the noise signal based on noise pickup device parameters 240. Specifically, based on noise pickup device parameters 240, noise DALC 222 performs digital-to-acoustic level conversion of (e.g., scales) the noise signal, and noise corrector 224 performs multiband noise correction on the converted or scaled noise signal, to produce a corrected noise signal. Noise correction path 206 provides the corrected noise signal to voice intelligibility calculator 210. Similarly, voice correction path 208 applies multiband voice correction to the voice signal. Specifically, based on playback device parameters 242, voice DALC 226 performs digital-to-acoustic level conversion of (e.g., scales) the voice signal, and voice corrector 228 applies multiband correction to the converted/scaled voice signal, to produce a corrected voice signal. Voice correction path 208 provides the corrected voice signal to voice intelligibility calculator 210.

Voice intelligibility calculator 210 performs multiband voice intelligibility analysis on the corrected noise signal and the corrected voice signal, to produce multiband voice intelligibility results (MVIR), and provides them to gain determiner 212. More specifically, short segment analyzer 230 performs multiband voice intelligibility analysis on short/medium length frames/segments of the corrected noise/voice to produce short/medium length segment multiband voice intelligibility results (also referred to as "short term voice intelligibility results" or simply "short term results"). The short term results include sequences of per-band voice intelligibility values, global voice intelligibility values, per-band noise power values, and per-band voice power values corresponding to sequences of the short/medium length segments of noise/voice.

On the other hand, long segment analyzer 232 performs long term noise and voice profiling (including voice intelligibility analysis) on long frames/segments of the corrected noise/voice, which are longer than the short/medium length segments, to produce long segment voice intelligibility results (also referred to as "long term voice intelligibility results" or simply "long term results"), such as long term per-band voice intelligibility values, and long term global gain values. For example, the long term noise and voice profiling may perform moving averages over values in the sequences of the short term results (e.g., over time periods equal in length to the long segments), to produce the long term results. Also, the long term noise and voice profiling may employ other types of long term processing of the short term results, such as peak holding and resetting of noise/voice power values across multiple short/medium length segments, for example, as described below.

Silence/pause detector 234 detects silence/pauses in the corrected voice signal to interrupt intelligibility analysis during silence, e.g., to prevent activation of the intelligibility analysis during silence, and so on.

The voice intelligibility results provided to gain determiner 212 may include a combination of the short term results and the long term results. Gain determiner 212 derives global and per-band gains for short/medium length segments based on the aforementioned voice intelligibility results, and provides the gains to voice enhancer 204. Voice enhancer 204 may include a voice compressor, voice expander, formants enhancer, and so on. Voice enhancer 204 performs voice enhancement processing on the (uncorrected) voice signal based in part on analysis results 205. For example, voice enhancer 204 applies the gains to the voice signal to produce the intelligibility enhanced voice signal, which is played back through system volume control 122 and loudspeaker 124.

Embodiments presented herein include, but are not limited to, the multiband noise and voice correction performed by noise and voice correction paths 206, 208, the short/medium length segment voice intelligibility analysis performed by short segment analyzer 230, the long term noise and voice profiling performed by long segment analyzer 232, and global and per-band gain analysis performed by gain determiner 212. The embodiments are described more fully below.

Multiband Noise and Voice Correction

Multiband noise and voice analysis is known. One form of such analysis includes the Speech Intelligibility Index (SIT). SII analysis receives a multiband voice signal to be played back through a loudspeaker into an acoustic environment, and a noise signal representative of noise in the acoustic environment as detected by a microphone. The SII analysis computes (i) a difference between levels of the voice signal and the noise signal per frequency band of the voice signal, e.g., computes a speech-to-noise ratio (SNR) per frequency band of the voice signal, multiplies the per-band SNRs by a band-importance function for the corresponding frequency band, and sums the result.

Figure 3:
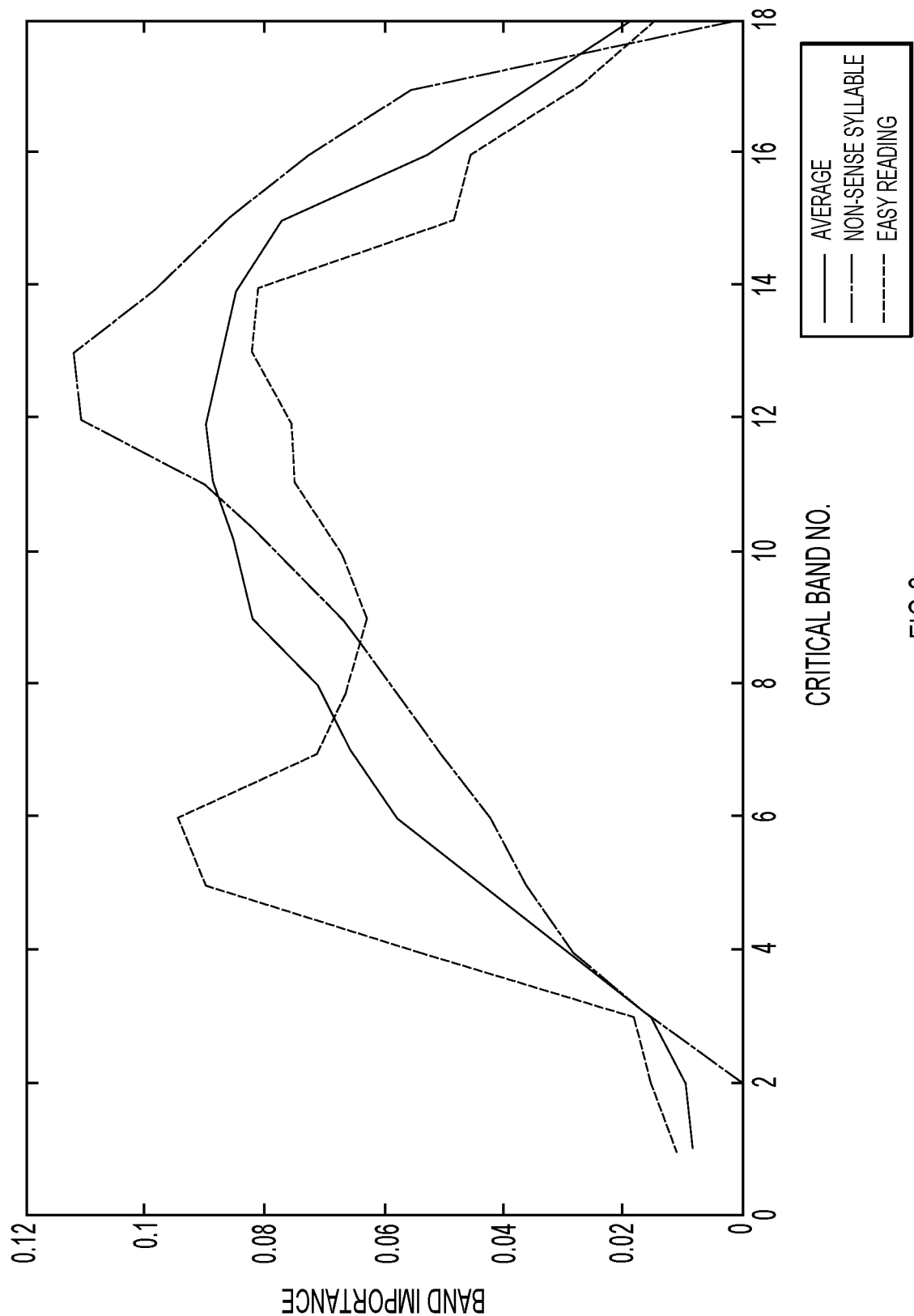
FIG. 3 shows example plots for band-importance functions of the Speech Intelligibility Index (SII).

FIG. 3 shows different plots for the band-importance function of the Speech Intelligibility Index. The band-importance function essentially applies different weights to the frequency bands of the voice signal according to their contribution/importance to voice/speech intelligibility. Along with the band-importance function, studies discuss how a fundamental and a first formant of human speech may not affect speech/voice intelligibility as compared to second formants and other factors. These are important factors to consider when calculating the intelligibility of the voice.

Straightforward manipulation of the frequency response of the voice signal based on the intelligibility index, or of the intelligibility contribution factors of each frequency band, may degrade the quality of voice on playback through the loudspeaker. For example, such manipulation can cause the voice to sound unnatural when changing a frequency balance and/or introducing fluctuations for temporal changes. Besides, results of the above-mentioned intelligibility analysis (e.g., the SII) will not be accurate if, prior to the intelligibility analysis, transducer frequency responses (e.g., frequency responses of the microphone and the loudspeaker) are not compensated. Moreover, if limitations of the loudspeaker (e.g., its small size or small driver) prevent the loudspeaker from reproducing a full frequency bandwidth of the voice, the loudspeaker can further degrade voice/speech quality for changing frequency balance as well as causing an inaccurate voice intelligibility result. Increasing the gain of the voice frequencies that the loudspeaker is incapable of reproducing does not solve the problem and can cause non-linear distortion and/or can stress the driver of the loudspeaker.

Figure 4:
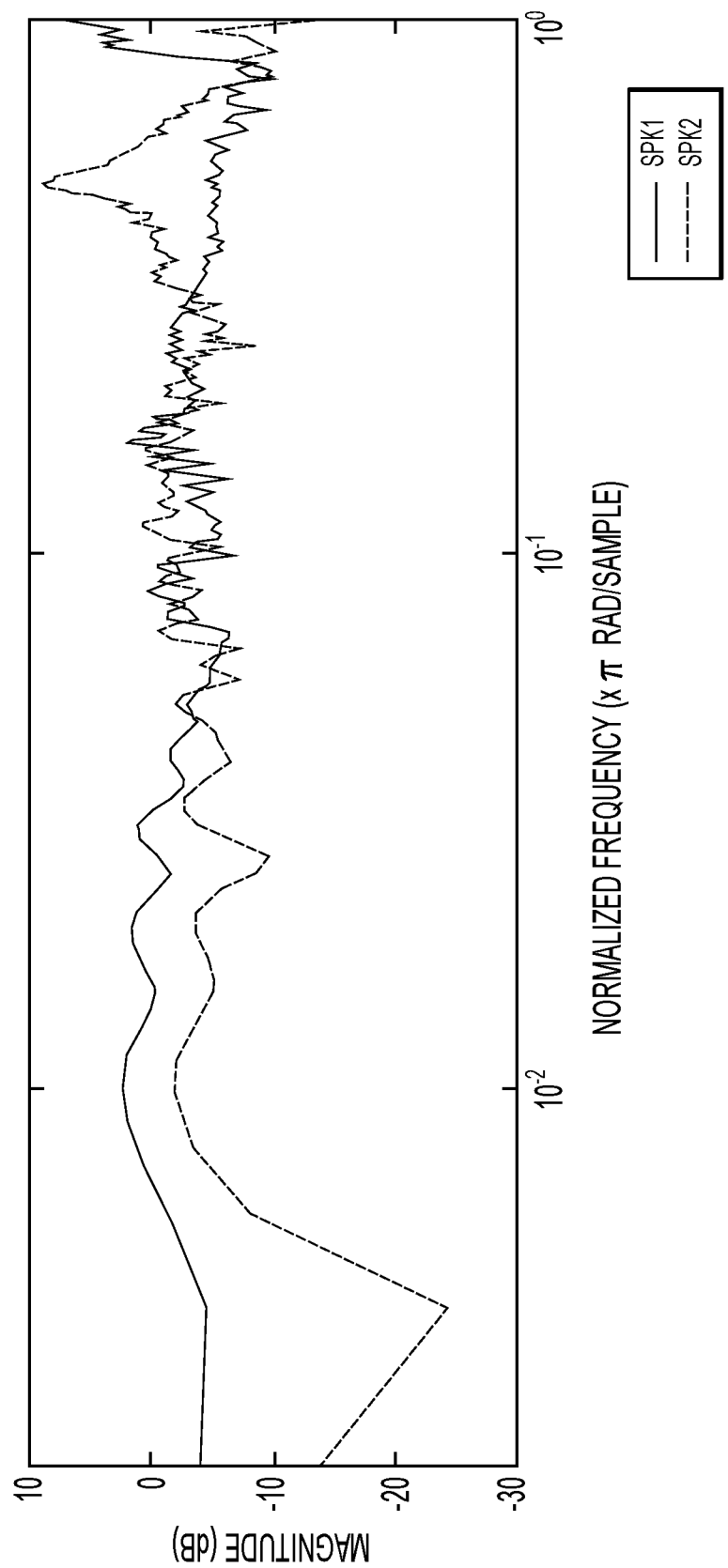
FIG. 4 shows example loudspeaker frequency responses for two different loudspeakers.

FIG. 4 shows loudspeaker frequency responses for two different loudspeakers, denoted spk1 and spk2. Because the transducer characteristics are different from loudspeaker to loudspeaker, and from microphone to microphone, loudspeaker compensation and microphone compensation for a given system should be considered when computing multiband voice intelligibility.

Accordingly, the multiband noise and voice correction performed by noise and voice correction paths 206, 208 correct the frequency bands of noise and voice used for computing multiband voice intelligibility results based on characteristics of the loudspeaker and the microphone, respectively, in addition to the intelligibility contribution factor for each of the frequency bands. As an example, noise correction path 206 corrects frequency bands (e.g., adjusts power levels of the frequency bands) of the noise signal ($H_{ns}$) based on noise pickup device parameters 240, to produce the corrected noise signal ($H_{An\_ns}$), and voice correction path 208 corrects frequency bands (e.g., adjusts power levels of the frequency bands) of the voice signal ($H_{spch}$) based on playback device parameters 242, to produce the corrected speech signal ($H_{An\_spch}$). Voice intelligibility calculator 210 then performs multiband voice intelligibility analysis on the corrected noise signal ($H_{An\_ns}$) and the corrected voice signal ($H_{An\_spch}$).

Examples of noise pickup device parameters 240 include a transfer function $H_{mic}$ of the microphone (e.g., a known microphone transfer function), a gain $g_{mic}$ associated with the microphone (i.e., an output gain of the noise signal), an acoustic-to-digital conversion gain $c_{mic}$ for the noise signal, and a sensitivity of the microphone. Examples of playback device parameters 242 include a transfer function $H_{spk}$ of the loudspeaker (i.e., a known loudspeaker transfer function), a gain $g_{spk}$ associated with the loudspeaker (i.e., an output gain of the voice signal), an acoustic-to-digital conversion gain $c_{spk}$ for the voice signal, and a sensitivity of the loudspeaker (which may be separately provided or incorporated into the other parameters). The transfer functions may include a frequency domain representation of a time-domain impulse response of the corresponding transducer (e.g., microphone or loudspeaker), including magnitude and phase information across multiple contiguous frequency bands that span the transfer function.

As an example, voice correction path 208 corrects the voice signal ($H_{spch}$) (e.g., the frequency spectrum of the voice signal) using playback device parameters 242 to produce the corrected voice signal ($H_{An\_spch}$) in the z-domain, according to the following equation:

$$H_{An\_spch}(z) = H_{spch}(z) * H_{spk}(z) * g_{spk} * c_{spk}. \qquad \text{Eq. (1)}$$

For example, voice DALC 226 scales the voice signal based on parameters $g_{spk}$ and $c_{spk}$, while voice corrector 228 performs multiband correction of the scaled voice signal based on loudspeaker transfer function $H_{spk}(z)$.

Similarly, noise correction path 206 corrects the noise signal ($H_{ns}$) using noise pickup device parameters 240 to produce the corrected noise signal ($H_{An\_ns}$) in the z-domain, according to the following equation:

$$H_{An\_ns}(z) = H_{ns}(z) * H_{mic}(z)^{-1} * g_{mic} * c_{mic}. \qquad \text{Eq. (2)}$$

For example, noise DALC 222 scales the noise signal based on parameters $g_{mic}$ and $c_{mic}$, while noise corrector 224 performs multiband correction of the scaled noise signal based on microphone transfer function $H_{mic}(z)$. This produces an accurate estimate of the noise in the acoustic environment.

The above-mentioned scaling of the noise and voice signals may include scaling based in part on microphone sensitivity and speaker sensitivity, respectively. In one example, a scaled noise/voice value is given by:

$$\text{Scale\_val} = 10^{(A/20)} / 10^{(D/20)} = 10^{((A-D)/20)},$$

Where A=acoustic level (dB) and D=equivalent digital level (dB).

Such scaling is performed separately with respect to microphone 104 and loudspeaker 124 in order to match the respective input signal (i.e., noise or voice) to its corresponding acoustic level (in dB). Alternatively, scaling may be performed to align noise and voice levels for microphone and loudspeaker sensitivity. As a subsequent voice intelligibility computation performed on the scaled values uses a ratio of the (corrected) voice signal and the (corrected) noise signal from the same acoustic environment, if a delta caused by different microphone and loudspeaker sensitivities is adjusted, the intelligibility computation will be accurate.

In that case:

$$\text{Scale\_val\_mic} = 10^{(Aspk/20)} / 10^{(Amic/20)},$$

Where $A_{spk}$ and $A_{mic}$ are measured/calculated acoustic levels (dB) based on the same level of digital level (dBFS).

The scaled value may only be applied to the noise signal because the scaling adjusts the relative delta. Alternatively, an inverse of Scale_val_mic may be applied only to the voice signal.

The voice and noise signal corrections of Eqs. (1) and (2) improve the subsequent multiband voice intelligibility analysis. In addition to the voice and noise corrections, embodiments presented herein perform multiband (frequency) region analysis on frequency responses of microphone 104 and loudspeaker 124. The multiband region analysis may be performed in noise correction path 206, voice correction path 208, and/or voice intelligibility calculator 210, or by a separate module of voice and noise analyzer 202. The multiband region analysis examines/determines overlapping and non-overlapping inter-relationships between the frequency range of the microphone and the frequency range of the loudspeaker and, based on their determined inter-relationships, divides the frequency bands used for the multiband voice intelligibility analysis into different frequency analysis regions/ranges. Then, the multiband voice intelligibility analysis is performed based on (i.e., taking into account) the different frequency analysis regions established by the multiband region analysis. For example, the multiband voice intelligibility analysis may apply different types of intelligibility analysis to the voice analysis bands within the different frequency analysis ranges, as described below.

Figure 5:
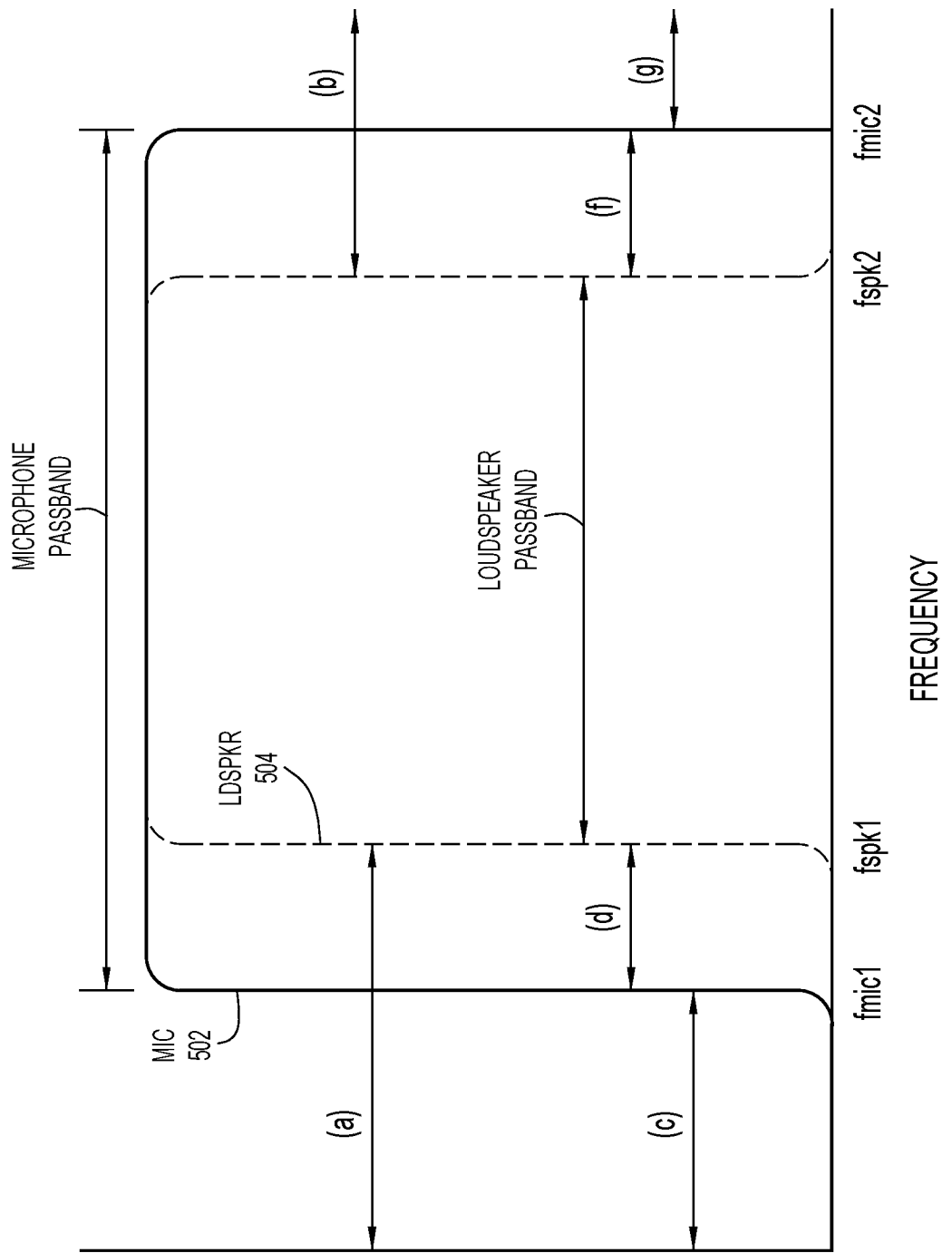
FIG. 5 is a frequency plot of an example idealized microphone frequency response and an example idealized loudspeaker frequency response, and various frequency analysis ranges determined based on inter-relationships between the two frequency responses.

FIG. 5 shows frequency plots of an idealized (brick wall) microphone frequency response 502 and an idealized loudspeaker frequency response 504, and various frequency analysis ranges (a)-(g) determined by the multiband region analysis based on inter-relationships between the two frequency responses. Microphone frequency response 502 has a useful/responsive microphone frequency range or bandwidth (BW)/frequency passband (e.g., a 3 dB BW, although other measures of what is considered a useful microphone passband may be used) that extends from a minimum ("min")/start frequency fmic1 to a maximum ("max")/stop frequency fmic2 of the microphone frequency response. Similarly, loudspeaker frequency response 504 has as useful/responsive loudspeaker frequency range or BW/frequency passband (e.g., a 3 dB BW, although other measures of what is considered a useful loudspeaker passband may be used) that extends from a minimum/start frequency fspk1 to a maximum/stop frequency fspk2 of the loudspeaker frequency response.

In the example of FIG. 5, the minimum or start frequencies fspk1, fmic1 are related by fspk1>fmic1, and the maximum or stop frequencies fmic2, fspk2 are related by fmic2>fspk2. Therefore, the microphone passband is greater than, and completely encompasses, the loudspeaker passband, i.e., the loudspeaker passband is fully within the microphone passband. In this case, the loudspeaker passband and the microphone passband overlap across the loudspeaker passband only. In another example, the reverse may be true, i.e., the minimum frequencies are related by fmic1>fspk1, and the maximum frequencies are related by fspk2>fmic2, such that the loudspeaker passband is greater than, and completely encompasses, the microphone passband, i.e., the microphone passband is fully within the loudspeaker passband. In this case, the loudspeaker passband and the microphone passband overlap across the microphone passband only.

In the example of FIG. 5, the multiband region analysis may classify frequency analysis regions (a)-(g) (referred to simply as "regions (a)-(g)") with respect to performing multiband voice intelligibility in the regions, according to the following:

a. Regions (a) and (b) may be defined as regions to remain unchanged by the voice intelligibility analysis, or as attenuation regions for headroom preservation, i.e., to preserve headroom.

b. Regions (c) and (g) should not be included in the voice intelligibility analysis because the noise capture device (e.g., the microphone) cannot provide an accurate analysis result. The frequency regions/areas below fmic1 and above fmic2 include unstable capture frequency regions/bands where the inverse of $H_{mic}$ (i.e., $H_{mic}^{-1}$) is insufficiently stable to apply to the noise signal for noise correction.

c. Regions (d) and (f) should be included in the voice intelligibility analysis for calculating a (global) noise level and a masking threshold, but not for the per-band voice intelligibility analysis; for example, any per-band voice level increase in regions (d) and (f) resulting from the voice intelligibility analysis cannot be accommodated by the playback device, which is unresponsive in those regions.

d. For an arrangement of the loudspeaker and microphone frequency responses that is opposite to that shown in FIG. 5, i.e., the loudspeaker passband is greater than the microphone passband, a noise signal level in region (d) (i.e., between fspk1 and fmic1) may be approximated using a noise signal level in a frequency band adjacent to the region, e.g., one above/adjacent to fmic1. In that case, the corrected noise signal may be computed as: $H_{An\_ns}(k) = \text{alpha} \cdot H_{An\_ns}(k+1)$, where alpha is an approximation coefficient in a range 0 to 1.0, although the minimum value is preferably greater than 0.

In the example of FIG. 5, in which the microphone passband is wider than and encompasses the loudspeaker passband, regions (d) and (f) should be included in the global noise level and the masking threshold computations because the level of the noise signal is assumed to be accurate after the correction of Eq. (2) has been applied to the noise signal. However, in the alternative/reverse example, in which the loudspeaker passband is wider than and encompasses the microphone passband, the handling of regions (d) and (f) should be different because the level of the noise signal in the regions is not accurate, whereas the level of the speech signal is accurate. In this case, the regions (d) and (f) can be excluded from both the global and the per-band analysis.

Taking into account the frequency analysis ranges as described above improves the accuracy of the voice intelligibility analysis as the frequency bands with the inaccurate noise level are removed from analysis. The voice intelligibility analysis also provides an optimum global voice intelligibility result and per-band voice intelligibility result by handling the difference in the frequency ranges/passbands of the loudspeaker and the microphone.

The voice correction and the noise correction can, then, be combined with the intelligibility contribution factor for each frequency band (i.e., for each of the voice analysis bands). For example, using the voice/noise corrections, the per-band (voice) intelligibility values $V_{idx}(i)$ (for frequency bands i=1 to N) can be calculated according to:

$$V_{idx}(i) = I(i) * A(i), i = \text{from max}(fmic1, fspk1) \text{ to}$$
$$\text{min}(fmic2, fspk2), \qquad \text{Eq. (3)}$$

Where: i=band index that identifies a given band (e.g., band i=1 to band i=21);
I=importance factor;
A=band audibility value; and
The function max(fmic1, fspk1) to min(fmic2,fspk2) determines/defines a frequency overlap between the loudspeaker and microphone passbands (e.g., an "overlap passband" over which the loudspeaker and microphone passbands overlap).

Voice and noise analyzer 202 determines the overlap passband based on the start frequencies and the stop frequencies of the loudspeaker and the microphone using the relationships above.

Band audibility value A is based on the corrected voice signal and the corrected noise signal voice from Eqs. (1) and (2), respectively. For example, band audibility value A may be proportional to a ratio of corrected voice signal power to corrected noise signal power in the given band. The per-band frequency analysis range is defined/corrected based on noise pickup device parameters 240 and playback device parameters 242, described above.

It follows from the above that Eq. (3) produces voice intelligibility results from voice analysis bands 1 to N based on the different frequency analysis regions as follows:
  a. From band 1 (i.e., lowest frequency band) to max (fmic1, fspk1)=>intelligibility N/A.
  b. From fspk1 to fspk2=>per-band voice intelligibility values are given by Eqs. (1) and (2).
  c. From min(fmic2,fspk2) to band N (i.e., highest frequency band)=>intelligibility N/A.

If max(fmic1, fspk1) is fspk1, the region (a) shown in FIG. 5 can be attenuated to preserve headroom for the processing. If max(fmic1, fspk1) is fmic1, the region below fspk1 can be utilized for preserving headroom. This headroom can be critical in some cases where the voice signal reaches the maximum (or close to the maximum) output level of the system (e.g., the loudspeaker). In that case, intelligibility cannot be increased because there is no headroom for the voice intelligibility analysis. Alternatively, a compressor/limiter may be introduced to increase root-mean-square (RMS) values while preserving a peak value of the voice signal; however, this can introduce compression artifacts such as unnatural sound and "pumping" if the amount of compression exceeds a certain level. Thus, if the loudspeaker cannot fully reproduce a certain range of frequencies in a region, the voice signal in that region can be attenuated to preserve more headroom.

Utilizing the voice correction and its analysis region calculation, a global voice intelligibility value (also referred to as global speech-to-noise ratio (SNR) (Sg), equivalently referred to as a global voice-to-noise ratio) may be computed in accordance with the following equation:

$$Sg = \propto * \left( \frac{\left(\sum_{j=C1}^{C2} H_{spch}(j)\right)^2}{\left(\sum_{i=fmic1}^{fmic2} H_{noise}(i)\right)^2} \right). \qquad \text{Eq. (4)}$$

Where: C1=fmic1, if fmic1≥fspk1, or C1=fspk1, if fmic1<fspk1;
C2=fmic2, if fmic2<fspk2, or C2=fspk2, if fmic2≥fspk2;
∝ is normalization coefficient; and
$H_{spch}(j)$ and $H_{noise}(i)$ are corrected voice and noise signals in $j^{th}$ and $i^{th}$ frequency bands, respectively.

According to the above relationships, frequency C1=max (fmic1, fspk1), frequency C2=min(fmic2, fspk2), and frequency range C1 to C2 is an overlap frequency range (i.e., overlap passband) between the microphone passband and the loudspeaker passband. The numerator of Eq. (4) accumulates/sums corrected voice power only over the overlap frequency range, while the denominator accumulates/sums corrected noise power only over the frequency range/passband of the microphone.

Short segment analyzer 230 produces a sequence of per-band voice intelligibility values computed according to Eq. (3), and a sequence of global speech-to-noise ratios (Sg) computed according to Eq. (4). Long segment analyzer 232 processes (e.g., averages) stored values (i.e., sequences of values) of noise powers and voice powers from short segment analyzer 230 over a number of short/medium length segments equal to the long segment to produce per-band intelligibility values for the long segment and a global intelligibility value for the long segment. Long segment analyzer 232 may perform further operations on the short term stored values, such as peak hold and reset, as described below.

The embodiment described above in connection with FIG. 5 determines analysis regions that are used as frequency range settings or limits for Eqs. (3) and (4). In another embodiment, respective weight coefficients may be applied directly to $H_{An\_spch}$ and $H_{An\_ns}$ to essentially compute Eqs. (3) and (4) without limiting the range, since the limiting is included in the respective weight coefficients. In this embodiment, corrections are applied according to the following:

$$H_{An\_spch} = W_{sp} * H_{An\_spch}.$$

$$H_{An\_ns} = W_{ns} * H_{An\_ns},$$

Where, $W_{sp}$ and $W_{ns}$ are weighting coefficients for voice and noise that are applied to each frequency band (0 to pi).

In summary, the embodiments provide a comprehensive method of computing noise/voice intelligibility using the noise/voice correction as:

a. Using the playback and the noise capture device characteristics, correct the voice and noise signals and define the frequency bands or ranges of the voice and noise for analysis.

b. Cross-examine the voice intelligibility contribution weighting coefficients and frequency ranges of the devices.

c. With given voice and noise inputs to voice and noise analyzer 202, perform analysis to produce the voice intelligibility values with processing gain parameters of each band and/or global processing gain value.

Note that for the analysis described herein, frequency bands are not limited to a certain bands. The frequency bands may be octave bands, one-third-octave bands, critical bands, and the like.

Short/medium Length Segment Voice intelligibility Analysis

Many voice playback use cases require minimum latency. Therefore, it is not practical to use a long segment (e.g., i.e., long voice/noise segments) that is approximately a second or more for voice intelligibility analysis (referred to as "long segment analysis") because the long segment analysis may introduce too much latency. In contrast, typically, a short/medium length segment for analysis and processing voice/noise is approximately 2 to 32 ms duration. Also, noise may not be static, but dynamic, e.g., consider a dog barking, a loud car passing, and so on. Therefore, multiband voice intelligibility analysis of a short/medium length segment (referred to as "short/medium length segment analysis") that is relatively shorter than the long segment is preferable. That is the short/medium length segment analysis is often preferred over longer term analysis.

An issue with the short/medium length segment analysis is that, when combined with other processing (e.g., gain processing), the short/medium segment length analysis can create unwanted artifacts. For example, an adaptation of the processing gain that is too fast can cause unnatural voice fluctuation as well as frequent voice frequency balance changes. A common method for mitigating such artifacts is to add smoothing to gain changes by setting an attack and decay time.

However, such smoothing of the voice intelligibility result introduces a trade-off between accuracy and stability. In order to achieve optimum accuracy while maintaining a stable voice sound, longer-term voice and noise profiling can improve outcomes. Unlike conventional methods, embodiments presented herein combine conventional short/medium length segment analysis with long term voice and noise profiling, as described below.

Long Term Voice and Noise Profiling

In contrast to the short/medium length segment of 2 to 32 ms, long segments analyzed by the long term voice and noise profiling may be a length of two words to a few sentences (e.g., approximately from 1 to 30 seconds). For the long term voice and noise profiling, it is unnecessary to store the noise/voice signal over the long term. Rather, the long term voice and noise profiling accumulates short term results (i.e., short/medium length segment characteristics) over time (i.e., over the long segment) with a sliding window. The long term analysis that results from the long term voice and noise profiling does not increase the latency of the voice intelligibility result because the long term analysis employs the past samples of the voice and the noise.

Figure 6:
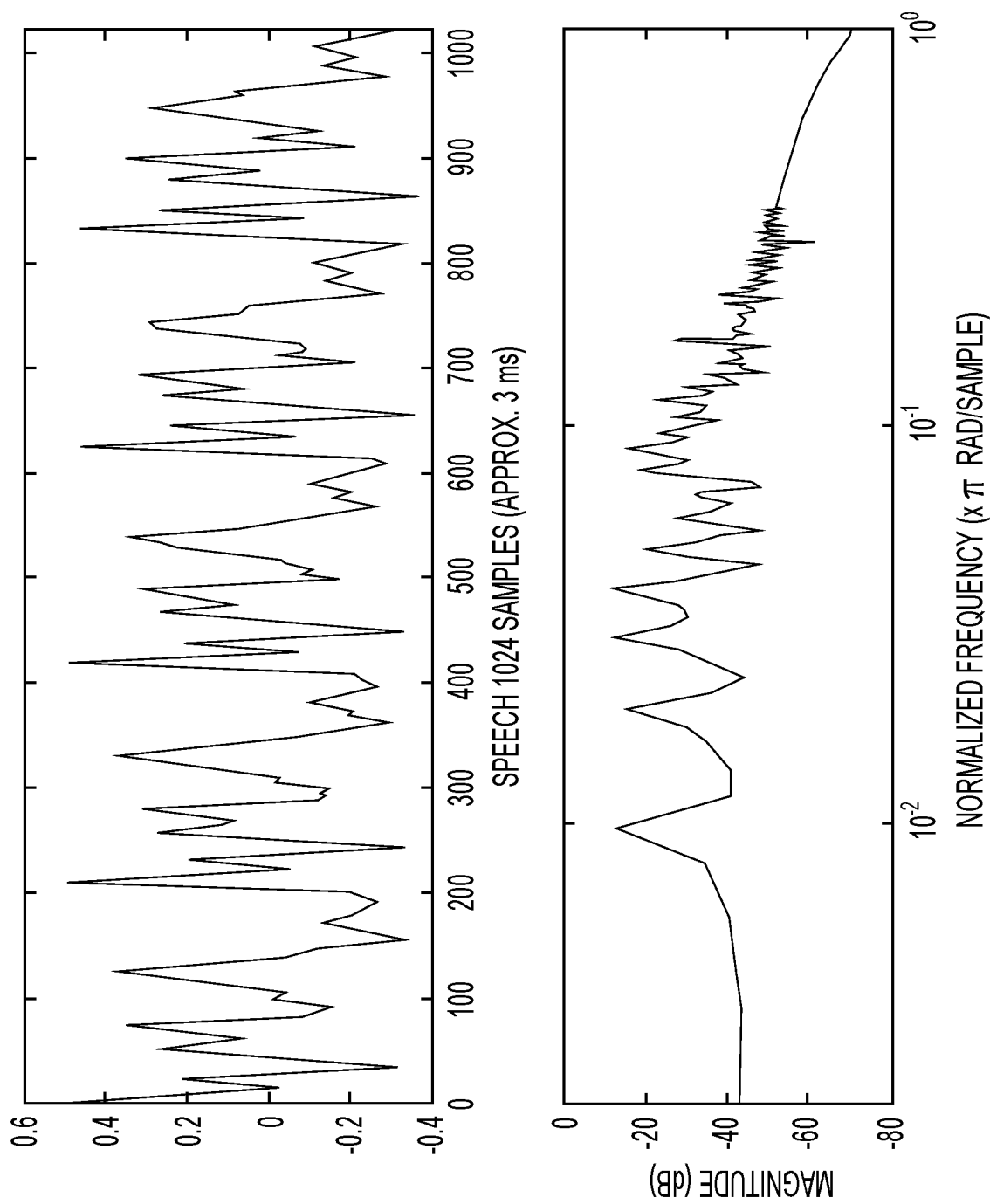
FIG. 6 shows plots of a short segment of a voice signal and its corresponding frequency spectrum.
Figure 7:
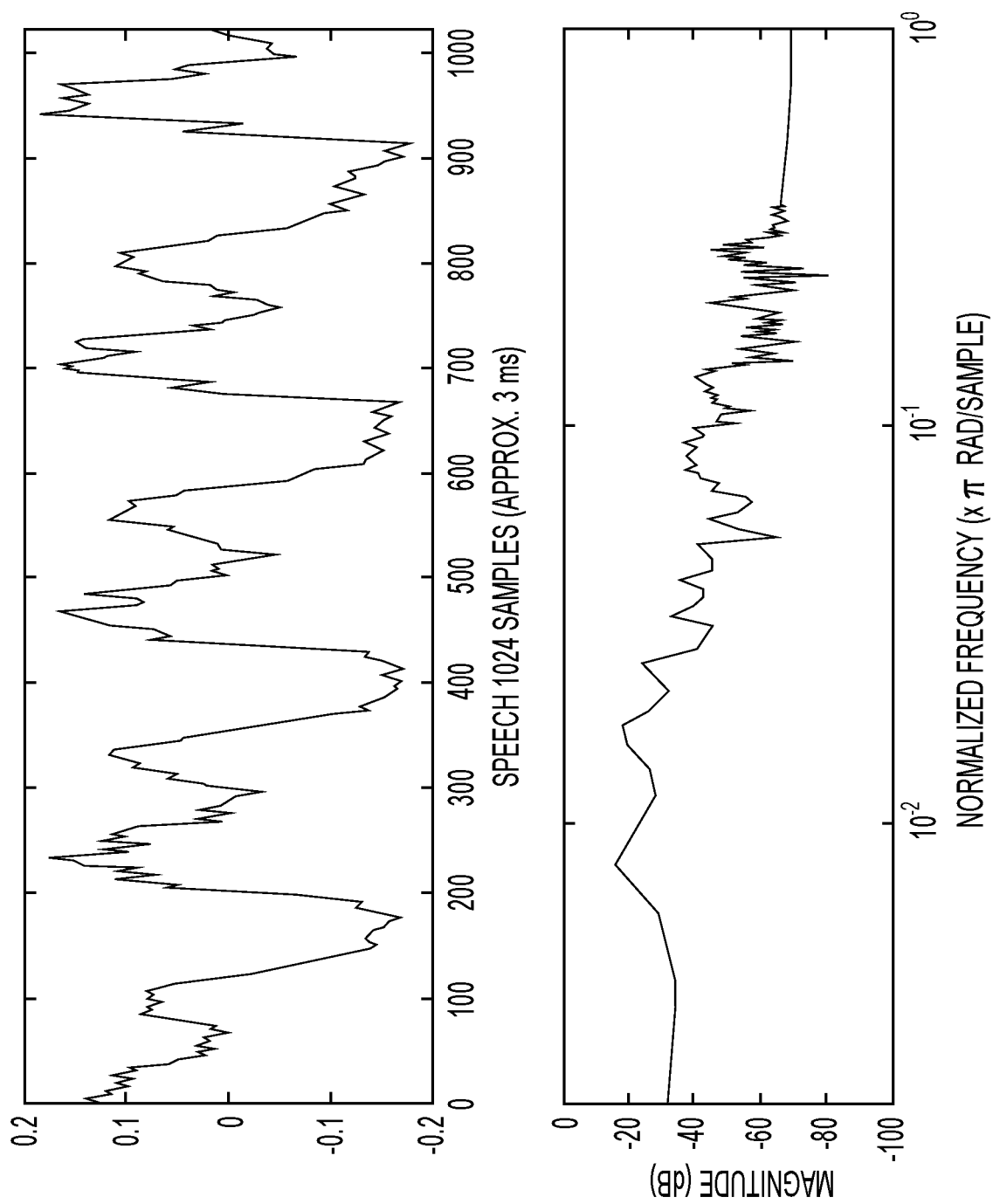
FIG. 7 shows plots of another short segment of the voice signal and its corresponding frequency spectrum.
Figure 8:
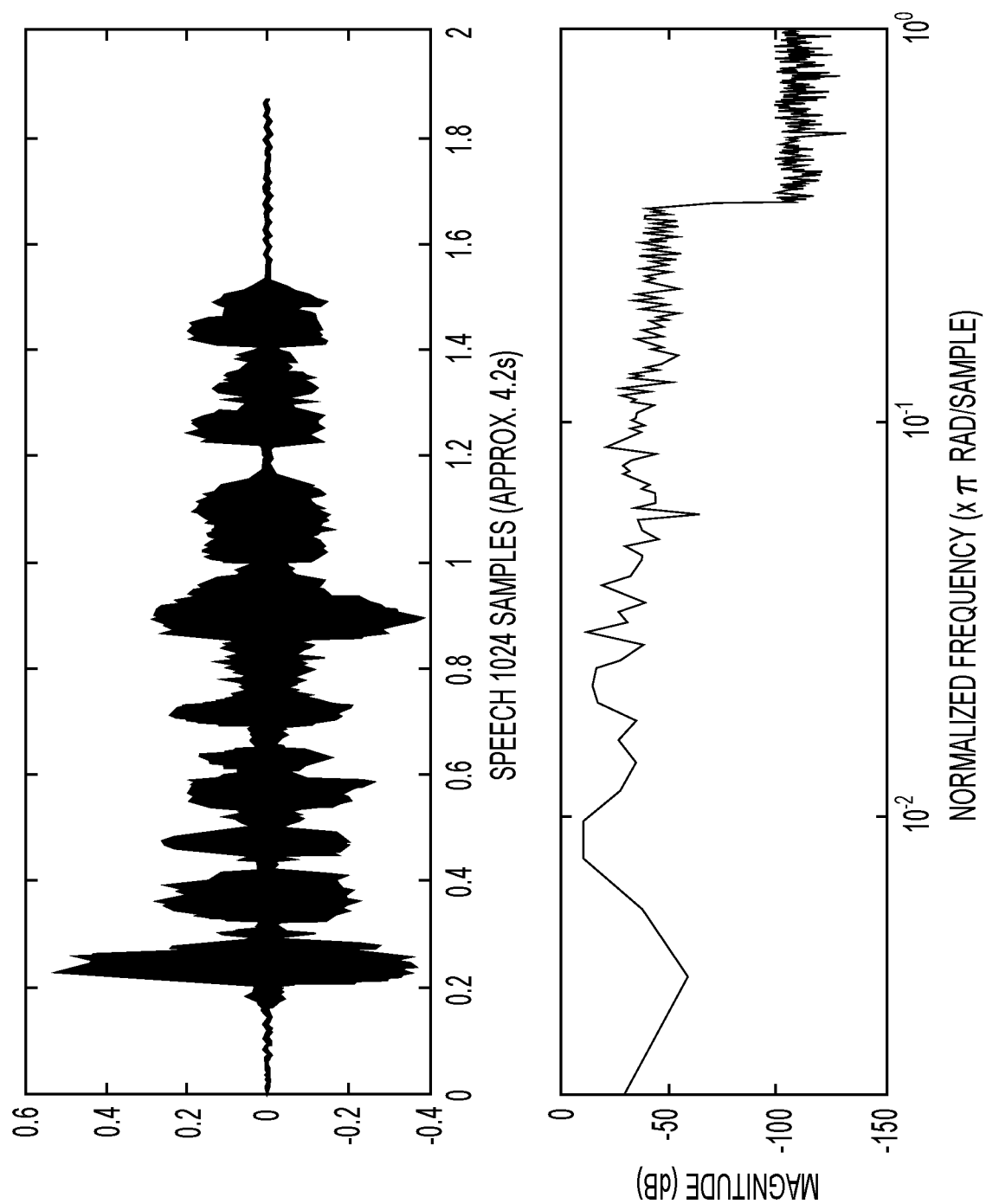
FIG. 8 shows plots of a long segment of the voice signal and its corresponding frequency spectrum.

FIGS. 6, 7, and 8 show different time segments of a voice signal and their corresponding frequency spectrums. FIG. 6 includes a top plot that shows a short time segment (i.e., "short segment") of the voice signal, and a bottom plot that shows a frequency spectrum of the short segment. The short segment includes 1024 voice samples spanning a short segment of approximately 23 ms. Similarly, FIG. 7 includes a top plot that shows another short segment of the voice signal, and a bottom plot that shows a second frequency spectrum of the short segment. The short segments shown in the top plots of FIGS. 6 and 7 are each periodic, as is typical for voice. The frequency spectrums shown in the bottom plots of FIGS. 6 and 7 differ because the different phonemes they represent have different formants frequencies.

FIG. 8 includes a top plot that shows a long time segment (i.e., "long segment") of the voice signal, and a bottom plot that shows a frequency spectrum of the long segment. The long segment includes 1024 voice samples spanning approximately 4.24 seconds. The short segments of FIGS. 6 and 7 and the long segment of FIG. 8 capture common data, including a fundamental frequency of the voice, but the long segment shows spectral characteristics of the voice over a longer period. Accordingly, voice intelligibility analysis that includes the long term voice and noise profiling may benefit from a broader frequency band analysis value, and capture long term characteristics of the voice signal over the long segment, instead of only trying to dynamically allocate a narrowband frequency gain based on per-band analysis, which can change rapidly over time. In addition, the long term voice and noise profiling also captures the temporal characteristics of the voice over the long segment.

Examples of consistent noise in an environment include fan noise or hum coupled with occasionally transient/dynamic noises, such as a dog barking and a car passing. In this case, the long term voice and noise profiling can identify the characteristics of the static/consistent noise, whereas the short/medium length segment analysis can identify the dynamic noise. The long term voice and noise profiling can capture peak noise, which can then be reset by comparing the long term results against the short term results to identify that consistent background noise has changed or has been removed. For example, the long term voice and noise profiling can include peak-holding the voice/noise for the long segment, but then use the short term results to determine whether to reset the peak, as the voice playback changes to another speaker or a synthesized voice, for example. Another example is to employ a few-words-length segment for analysis, so that a transition from one speaker to another can be slowly captured by the sliding window.

Global and Per-Band Gain Analysis

Gain determiner 212 computes multiband gain values including a per-band gain (adjustment) and a global gain (adjustment) to be applied to the (uncorrected) voice signal based on the results produced by short segment analyzer 230. Gain determiner 212 provides the gains to voice enhancer 204, which applies the gains to the voice signal.

The gain calculations can be flexible depending on the processing to be applied for increasing intelligibility. If there are computational resource constraints, the analysis bands can be grouped to effectively reduce the number of analysis bands to be processed, or some of the analysis bands may be omitted from processing. If the processing already contains certain intelligence, e.g., formants location enhancement, or spectral peak enhancement, the processing can use the intelligence to provide the intelligibility information on the frequency location where the processing is selectively increasing/decreasing its gain and appropriate global gain parameter based on the analysis methods described above.

In an example, the gains may be calculated according to the following, or similar, relationships $$\text{Global gain } (g\_Global) = Wg * St\_g / Sc.$$

$$\text{Per-band gain } (g\_perband(i)) = Wpb * St\_pb / Sc(i),$$

Where: g_Global and g_perband are applied to the voice output signal;
Wg and Wpb are global and per-band weight coefficients;
St_g and St_pb are short term/medium length segment per-band and global intelligibility values (e.g., speech-to-noise (SNR) values); and
Sc is a current SNR.

The weights Wg and Wpb may be determined based on a threshold of intelligibility value, such that the weights vary for current voice intelligibility values (e.g., when the intelligibility values are relatively high, apply more weight (Wg) to g_Global and less weight (Wpb) to g_perband, and vice versa).

Figure 9:
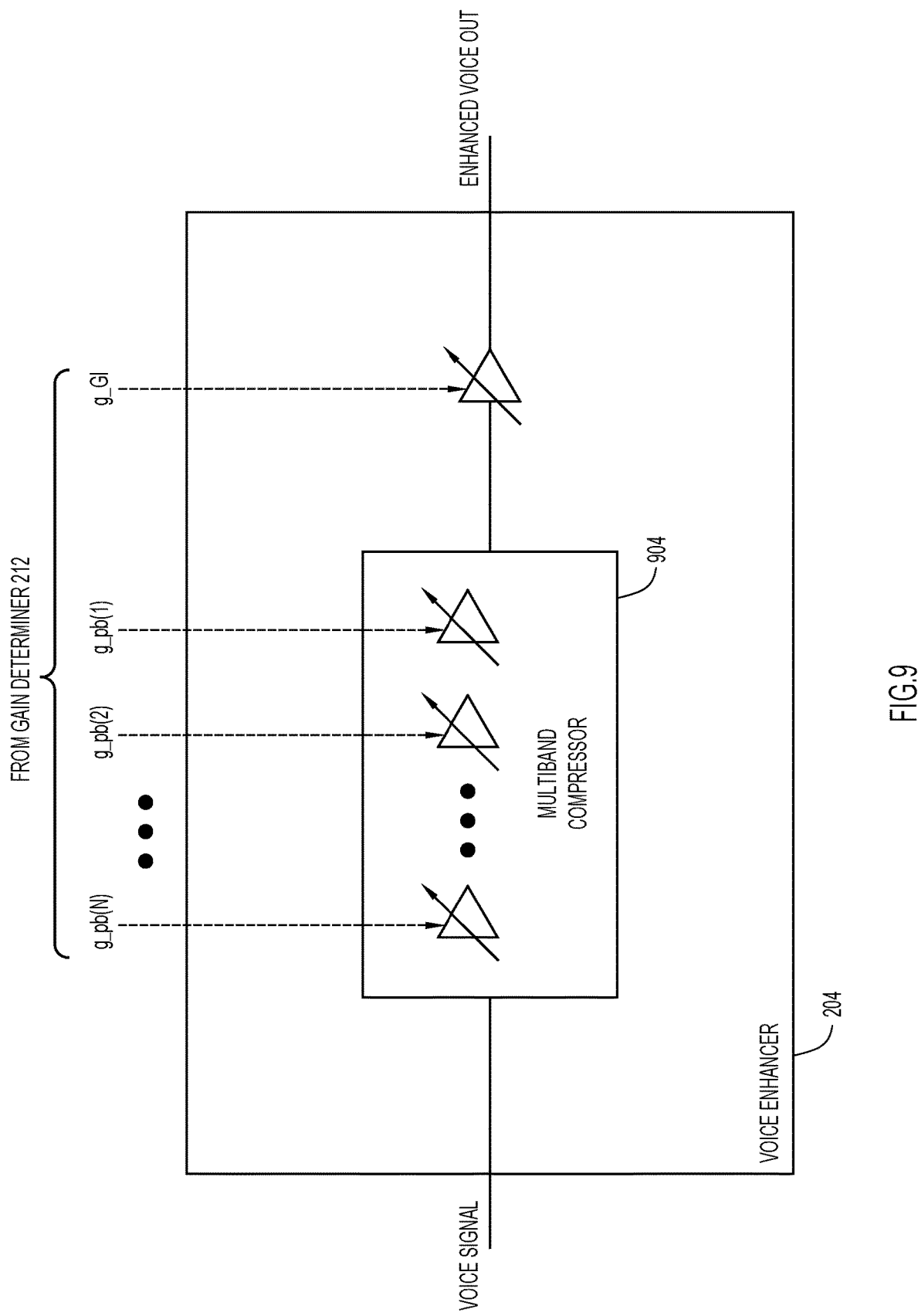
FIG. 9 is a high-level block/signal flow diagram of a portion of a voice enhancer of the VIP.

FIG. 9 is a high-level block/signal flow diagram of a portion of voice enhancer 204, according to an embodiment. In the example, voice enhancer 204 includes a multiband compressor 904 that applies per-band gain values g_pb(i) and global gain g_Global to the voice signal, to produce the intelligibility enhanced voice signal.

Figure 10:
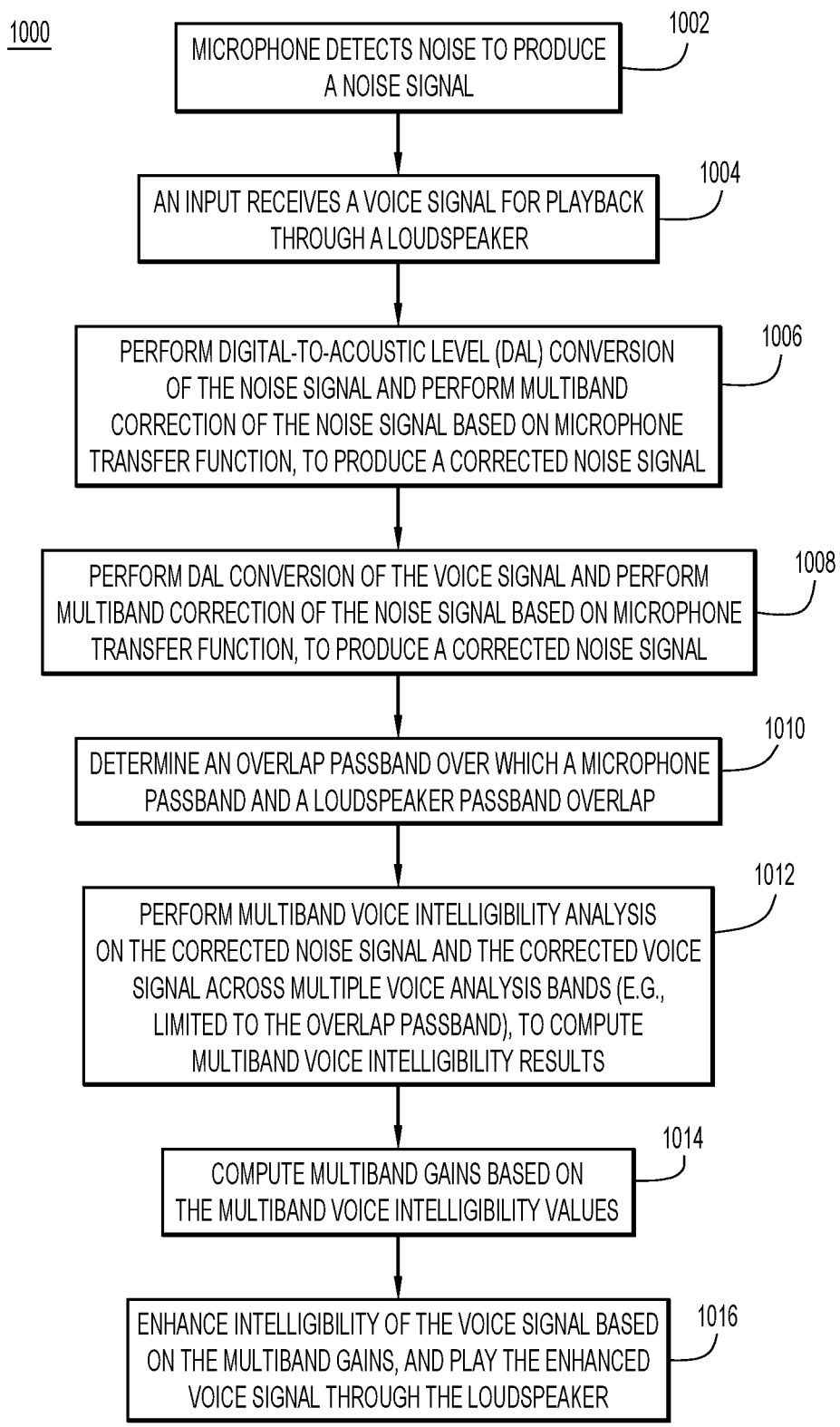
FIG. 10 is a flowchart of an example method of multiband voice intelligibility analysis/processing and voice intelligibility enhancement performed by the VIP.

FIG. 10 is a flowchart of an example method 1000 of performing voice intelligibility processing performed by VIP 120, for example. The operations of method 1000 are based on operations described above.

At 1002, a microphone detects noise in an acoustic environment, to produce a noise signal.

At 1004, an input of VIP 120 receives a voice signal for playback into the acoustic environment through a loudspeaker.

At 1006, VIP 120 performs digital-to-acoustic level (DAL) conversion of the noise signal, and performs multiband correction of the noise signal based on a known or derived microphone transfer function of the microphone, to produce a corrected noise signal. The multiband correction adjusts the spectrum of the noise signal to compensate for the microphone transfer function.

At 1008, VIP 120 performs DAL conversion of the voice signal, and performs multiband correction of the voice signal based on a known or derived loudspeaker transfer function of the loudspeaker to produce a corrected voice signal. The multiband correction adjusts the spectrum of the voice signal to compensate for the loudspeaker transfer function.

At 1010, VIP 120 determines a frequency analysis region for a multiband voice intelligibility computation based on a relationship between the microphone transfer function and the loudspeaker transfer function. For example, VIP 120 determines an overlap passband over which a microphone passband of the microphone transfer function and a loudspeaker passband of the loudspeaker transfer function overlap, based on start and stop frequencies of the passbands. The start and stop frequencies of a given passband may correspond to opposing 3 dB-down points (or other suitable "X" dB-down points) of the transfer function corresponding to the given passband, for example.

At 1012, VIP 120 performs multiband voice intelligibility analysis based on the noise signal (e.g., on the corrected noise signal) and based on the voice signal (e.g., on the corrected voice signal) across multiple voice analysis bands, to compute multiband voice intelligibility results. The analysis may be limited to voice analysis bands in the overlap passband, for example. The results include per-band voice intelligibility values and a global speech/voice-to-noise ratio. The multiband voice intelligibility analysis includes analysis of/based on short/medium length segments/frames to produce short term results, and analysis of/based on longer segments to produce long term results.

At 1014, VIP 120 computes per-band gains and a global gain based on the per-band voice intelligibility values and the global speech/voice-to-noise ratio.

At 1016, VIP enhances intelligibility of the voice signal based on the gains, and plays the enhanced voice signal through the loudspeaker.

In various embodiments, some of the operations of method 1000 may be omitted, and/or the operations of method 1000 may be reordered/permuted. For example, conversion/correction operations 1006 and 1008 may be omitted, such that operation 1012 performs the multiband voice intelligibility analysis based on the noise signal (without correction) and the voice signal (without correction) across the multiple voice analysis bands, to compute the multiband voice intelligibility results. In another example, operations 1006 and 1008 may be modified to omit their respective multiband corrections, thus leaving only their respective DAL conversions.

In an embodiment, a method comprises: detecting noise in an environment with a microphone to produce a noise signal; receiving a voice signal to be played into the environment through a loudspeaker; determining a frequency analysis region for a multiband voice intelligibility computation based on a relationship between a microphone transfer function of the microphone and a loudspeaker transfer function of the loudspeaker; and computing multiband voice intelligibility results over the frequency analysis region based on the noise signal and the voice signal. The method further comprises: performing multiband correction of the noise signal based on the microphone transfer function, to produce a corrected noise signal; and performing multiband correction of the voice signal based on the loudspeaker transfer function to produce a corrected voice signal, wherein the computing includes computing the multiband voice intelligibility results over the frequency analysis region based on the corrected noise signal and the corrected voice signal.

In another embodiment, an apparatus comprises: a microphone to detect noise in an environment, to produce a noise signal; a loudspeaker to play a voice signal into the environment based; and a controller coupled to the microphone and the loudspeaker and configured to perform: multiband correction of the noise signal based on a microphone transfer function of the microphone, to produce a corrected noise signal; multiband correction of the voice signal based on a loudspeaker transfer function of the loudspeaker to produce a corrected voice signal; computing multiband voice intelligibility results based on the corrected noise signal and the corrected voice signal; computing multiband gain values based on the multiband voice intelligibility results; and enhancing the voice signal based on the multiband gain values.

In yet another embodiment, a non-transitory computer readable medium is provided. The non-transitory computer readable medium is encoded with instructions that, when executed by a processor, cause the processor to perform: receiving, from a microphone, a noise signal representative of noise in an environment; receiving a voice signal to be played into the environment through a loudspeaker; digital-to-acoustic level conversion of the noise signal, and multiband correction of the noise signal based on a microphone transfer function, to produce a corrected noise signal; digital-to-acoustic level conversion of the voice signal, and multiband correction of the voice signal based on a loudspeaker transfer function, to produce a corrected voice signal; and computing, based on the corrected noise signal and the corrected voice signal, multiband voice intelligibility results including per-band voice intelligibility values and a global speech-to-noise ratio.

Although the techniques are illustrated and described herein as embodied in one or more specific examples, it is nevertheless not intended to be limited to the details shown, since various modifications and structural changes may be made within the scope and range of equivalents of the claims.

Each claim presented below represents a separate embodiment, and embodiments that combine different claims and/or different embodiments are within the scope of the disclosure and will be apparent to those of ordinary skill in the art after reviewing this disclosure.

What is claimed is:

1. A method comprising:
    detecting noise in an environment with a microphone to produce a noise signal;
    receiving a voice signal to be played into the environment through a loudspeaker;
    determining a frequency analysis region for a multiband voice intelligibility computation based on a relationship between a microphone transfer function of the microphone and a loudspeaker transfer function of the loudspeaker;
    performing multiband correction of the noise signal based on the microphone transfer function, to produce a corrected noise signal;
    performing multiband correction of the voice signal based on the loudspeaker transfer function, to produce a corrected voice signal;
    computing a global speech-to-noise ratio of (i) voice power based on the voice signal across a voice analysis bands limited to an overlap passband to (ii) noise power based on the noise signal across a microphone passband; and
    computing multiband voice intelligibility results over the frequency analysis region based on the corrected noise signal and the corrected voice signal, wherein the multiband voice intelligibility results include long segments analyzed by a long-term voice and noise profiling obtained based on an accumulation of short-term voice intelligibility results over time with a sliding window.

2. The method of claim 1, further comprising:
    enhancing intelligibility of the voice signal using the multiband voice intelligibility results.

3. The method of claim 1, wherein:
    determining includes determining, as the frequency analysis region, the overlap passband over which the microphone passband of the microphone transfer function and a loudspeaker passband of the loudspeaker transfer function overlap; and
    computing includes computing per-band voice intelligibility values across voice analysis bands limited to the overlap passband.

4. The method of claim 3, wherein determining includes:
    identifying start frequencies and stop frequencies that define the microphone passband and the loudspeaker passband, respectively; and
    computing the overlap passband as a passband that extends from a maximum of the start frequencies to a minimum of the stop frequencies.

5. The method of claim 1, wherein:
    computing the multiband voice intelligibility results includes computing per-band voice intelligibility values and a global voice-to-noise ratio.

6. The method of claim 1, wherein computing the multiband voice intelligibility results includes:
    performing multiband voice intelligibility analysis based on short/medium length segments of the voice signal and the noise signal, to produce short term voice intelligibility results; and
    performing multiband voice intelligibility analysis based on long segments of the voice signal and the noise signal that are longer than the short/medium length segments of the voice signal and the noise signal, to produce long term voice intelligibility results.

7. The method of claim 1, further comprising:
    prior to performing the multiband correction of the noise signal, performing digital-to-acoustic level conversion of the noise signal based on a sensitivity of the microphone; and
    prior to performing the multiband correction of the voice signal, performing digital-to-acoustic level conversion of the voice signal based on a sensitivity of the loudspeaker.

8. A method comprising:
    detecting noise in an environment with a microphone to produce a noise signal;
    receiving a voice signal to be played into the environment through a loudspeaker;
    determining a frequency analysis region for a multiband voice intelligibility computation based on a relationship between a microphone transfer function of the microphone and a loudspeaker transfer function of the loudspeaker;
    performing multiband correction of the noise signal based on the microphone transfer function, to produce a corrected noise signal;
    performing multiband correction of the voice signal based on the loudspeaker transfer function, to produce a corrected voice signal;
    computing multiband voice intelligibility results over the frequency analysis region based on the corrected noise signal and the corrected voice signal;
    determining whether a start frequency of a loudspeaker passband is greater than a start frequency of a microphone passband; and
    when the start frequency of the loudspeaker passband is greater, attenuating the voice signal in bands below the start frequency of the microphone passband.

9. An apparatus comprising:
    a microphone to detect noise in an environment, to produce a noise signal;

a loudspeaker to play a voice signal into the environment; and a controller coupled to the microphone and the loudspeaker and configured to perform:

multiband correction of the noise signal based on a microphone transfer function of the microphone, to produce a corrected noise signal;

multiband correction of the voice signal based on a loudspeaker transfer function of the loudspeaker to produce a corrected voice signal;

computing a global speech-to-noise ratio of (i) voice power based on the voice signal across a voice analysis bands limited to an overlap passband to (ii) noise power based on the noise signal across a microphone passband;

computing multiband voice intelligibility results based on the corrected noise signal and the corrected voice signal, wherein the multiband voice intelligibility results include long segments analyzed by a long-term voice and noise profiling obtained based on an accumulation of short-term voice intelligibility results over time with a sliding window;

computing multiband gain values based on the multiband voice intelligibility results; and enhancing the voice signal based on the multiband gain values.

10. The apparatus of claim 9, wherein the controller is further configured to perform:
enhancing intelligibility of the voice signal using the multiband voice intelligibility results.

11. The apparatus of claim 9, wherein the controller is further configured to perform:
determining the overlap passband over which the microphone passband of the microphone transfer function and a loudspeaker passband of the loudspeaker transfer function overlap,
wherein the controller is configured to perform computing by computing per-band voice intelligibility values across voice analysis bands limited to the overlap passband.

12. The apparatus of claim 11, wherein the controller is further configured to perform:
determining whether a start frequency of the loudspeaker passband is greater than a start frequency of the microphone passband; and
when the start frequency of the loudspeaker passband is greater, attenuating the voice signal in bands below the start frequency of the microphone passband.

13. The apparatus of claim 9, wherein:
the controller is configured to perform computing the multiband voice intelligibility results by computing per-band voice intelligibility values and a global speech-to-noise ratio.

14. The apparatus of claim 9, wherein computing the multiband voice intelligibility results includes:
performing multiband voice intelligibility analysis on short/medium length segments of the corrected voice signal and the corrected noise signal, to produce short term voice intelligibility results; and performing multiband voice intelligibility analysis on long segments of the corrected voice signal and the corrected noise signal that are longer than the short/medium length segments of the corrected voice signal and the corrected noise signal, to produce long term voice intelligibility results.

15. The apparatus of claim 9, further comprising:
prior to multiband correction of the noise signal, performing digital-to-acoustic level conversion of the noise signal based on a sensitivity of the microphone; and
prior to multiband correction of the voice signal, performing digital-to-acoustic level conversion of the voice signal.

16. A non-transitory computer readable medium encoded with instructions that, when executed by a processor, cause the processor to perform:
receiving, from a microphone, a noise signal representative of noise in an environment;
receiving a voice signal to be played into the environment through a loudspeaker;
digital-to-acoustic level conversion of the noise signal, and multiband correction of the noise signal based on a microphone transfer function, to produce a corrected noise signal;
digital-to-acoustic level conversion of the voice signal, and multi band correction of the voice signal based on a loudspeaker transfer function, to produce a corrected voice signal;
computing a global speech-to-noise ratio of (i) voice power based on the voice signal across a voice analysis bands limited to an overlap passband to (ii) noise power based on the noise signal across a microphone passband; and
computing, based on the corrected noise signal and the corrected voice signal, multiband voice intelligibility results, wherein the multiband voice intelligibility results include long segments analyzed by a long-term voice and noise profiling obtained based on an accumulation of short-term voice intelligibility results over time with a sliding window.

17. The non-transitory computer readable medium of claim 16, wherein the instructions to cause the processor to perform computing include instructions to cause the processor to perform a speech intelligibility index (SII) analysis of the corrected noise signal and the corrected voice signal across voice analysis bands.

18. The non-transitory computer readable medium of claim 16, further comprising instructions to cause the processor to perform:
determining the overlap passband over which the microphone passband of the microphone transfer function and a loudspeaker passband of the loudspeaker transfer function overlap,
wherein the instructions to cause the processor to perform the computing include instructions to cause the processor to perform computing a per-band voice intelligibility values across voice analysis bands limited to the overlap passband.

* * * * *